United States Patent
Jia et al.

(10) Patent No.: US 12,207,444 B2
(45) Date of Patent: Jan. 21, 2025

(54) SYSTEMS AND METHODS FOR AN ELECTRONIC DEVICE

(71) Applicant: Harman International Industries, Incorporated, Stamford, CT (US)

(72) Inventors: David Jia, Canton, MI (US); Jianing Chen, Northville, MI (US); Jon Curry, Commerce Township, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 241 days.

(21) Appl. No.: 17/818,657

(22) Filed: Aug. 9, 2022

(65) Prior Publication Data

US 2024/0057292 A1    Feb. 15, 2024

(51) Int. Cl.
```
H05K 7/20       (2006.01)
H05K 1/02       (2006.01)
H05K 5/02       (2006.01)
H05K 5/04       (2006.01)
H05K 7/14       (2006.01)
H05K 9/00       (2006.01)
```
(52) U.S. Cl.
CPC ....... *H05K 7/20409* (2013.01); *H05K 1/0201* (2013.01); *H05K 5/0213* (2013.01); *H05K 5/04* (2013.01); *H05K 7/1405* (2013.01); *H05K 7/20136* (2013.01); *H05K 7/20854* (2013.01); *H05K 9/0041* (2013.01)

(58) Field of Classification Search
CPC ............. H05K 7/20409; H05K 7/1405; H05K 7/20136; H05K 7/20854; H05K 1/0201; H05K 5/0213; H05K 5/04; H05K 9/0041

USPC .................................................. 361/679.02
See application file for complete search history.

(56) References Cited

U.S. PATENT DOCUMENTS

| | | | |
|---|---|---|---|
| 6,669,273 B1 * | 12/2003 | Glovatsky | B60K 37/00 174/254 |
| 6,930,891 B1 * | 8/2005 | Hama | H05K 9/0039 361/753 |
| 2017/0094779 A1 * | 3/2017 | Go | H05K 1/0201 |
| 2023/0066818 A1 * | 3/2023 | Trygubova | H05K 7/20481 |
| 2024/0155816 A1 * | 5/2024 | Matsuoka | B60R 16/02 |

FOREIGN PATENT DOCUMENTS

| | | | |
|---|---|---|---|
| EP | 0897656 A1 | 2/1999 | |
| EP | 1130953 A1 | 9/2001 | |
| EP | 1515598 A1 | 3/2005 | |
| FR | 2906105 A1 * | 3/2008 | ......... B60R 16/0239 |

OTHER PUBLICATIONS

European Patent Office, Extended European Search Report Issued in Application No. 23188657.3, Jan. 4, 2024, Germany, 9 pages.

* cited by examiner

*Primary Examiner* — Zhengfu J Feng
(74) *Attorney, Agent, or Firm* — McCoy Russell LLP

(57) ABSTRACT

Methods and systems for an electronic package for a vehicle are provided. In one example, the electronic package includes a chassis having a plurality of bent tabs forming a plurality of respective vent openings in the chassis, and a circuit board coupled to the chassis, wherein the bent tabs directly contact the circuit board.

19 Claims, 7 Drawing Sheets

SYSTEMS AND METHODS FOR AN ELECTRONIC DEVICE

FIELD

The disclosure relates to electronic devices, and more particularly, electronic devices including features and elements for shielding electromagnetic interference and thermal management.

BACKGROUND

Automotive infotainment systems including automotive head units provide a range of information and entertainment media for vehicle users. For example, infotainment systems may deliver information and entertainment via touchscreen displays, button panels and/or video interfaces, and smartphone-infotainment system integration.

SUMMARY

Automotive infotainment systems rely on electronic devices to control system performance. As one example, the electronic devices may include dense, integrated circuits that produce substantial heat and may be disrupted by electromagnetic interference (EMI) from other systems of the vehicle and outside sources. Packaging of the electronic devices included in automotive infotainment systems may include housing in a chassis. A chassis may include a number of features to meet requirements and challenges of the automotive environment including heat-dissipation from electronics and EMI.

For example, a chassis may be formed from heat-sinking materials. As another example, a chassis may include one or more of perforated holes, heat spreaders, air gaps, and mounting orientation to increase natural convection. In some examples, chassis may include a fan for forced convection. Chassis may include features to support adequate shielding from electromagnetic interference (EMI). For example, by forming a chassis from metal, as is traditional, the chassis may provide a Faraday cage for enclosed electronics.

Commonly, chassis may be secured to a part of the vehicle where space is constrained, such as mounted to an instrument panel, a center console, or a trunk. While the features described above may manage heat and EMI in some systems, increasingly electrified vehicles and increasingly high-performance infotainment systems may demand more robust EMI and heat management solutions for electronic devices. Improving chassis features to mitigate EMI and to cool electronics without increasing packaging size remains a challenge.

Embodiments are disclosed for an electronic package for a vehicle. The electronic package may include a chassis having a plurality of bent tabs forming a plurality of respective vent openings in the chassis, and a circuit board coupled to the chassis, wherein the bent tabs directly contact the circuit board. In one example the bent tabs may bend inward in a direction of an interior of the chassis. The bent tabs may comprise a bend and a fin having a first face, a second face, and a small side surface. In one example, a face of the fin may directly contact an external surface of the circuit board. In another example, the small side surface of the fin may directly contact an external surface of the circuit board.

In yet another embodiment, a method for cooling an electronic package may include operating a fan where the fan blows air from inside an enclosure to outside the enclosure, the enclosure comprised of a chassis having a fan, a plurality of bent tabs forming a plurality of respective vent openings in the chassis, and a circuit board coupled to the chassis, wherein the bent tabs directly contact the circuit board.

In yet another embodiment, a system for a vehicle may include a vehicle component, a chassis having a plurality of bent tabs forming a plurality of respective vent openings in the chassis mounted to the vehicle component, and a circuit board coupled to the chassis wherein the bent tabs directly contact the circuit board. In one example, the vehicle component may be an instrument panel. The chassis may include a housing and a cover plate. The cover plate may be fastened to the housing over the enclosed circuit board. A pair of brackets may be coupled to the housing, the cover plate, or both the housing and the cover plate. By inserting fasteners through the brackets, the chassis may be coupled to the vehicle component.

BRIEF DESCRIPTION OF THE DRAWINGS

The disclosure may be better understood from reading the following description of non-limiting embodiments, with reference to the attached drawings, wherein below.

DETAILED DESCRIPTION

The disclosure provides systems for an electronic package having thermal management and EMI shielding features. The electronic package may include a chassis having a plurality of bent tabs (also referred to as tabs herein) forming a plurality of respective vent openings in the chassis and a circuit board coupled to the chassis. The chassis may be made from a material such as sheet metal for advantages including increasing heat dissipation and providing contact points between the circuit board and the chassis for EMI shielding. Heat dissipation is increased by the bent tabs functioning as mini-fins, vent openings, and contacts for conducting heat from the circuit elements to the chassis. Moreover, the tabs increase heat sinking capacity of the chassis without increasing the overall footprint of the enclosure. The chassis may include a number of additional features such as brackets and dimples for transferring heat from the circuit board to the chassis, and air gaps and fans for enhancing convective cooling. In some examples, the features may work synergistically to increase cooling without increasing package size.

Figure 1:
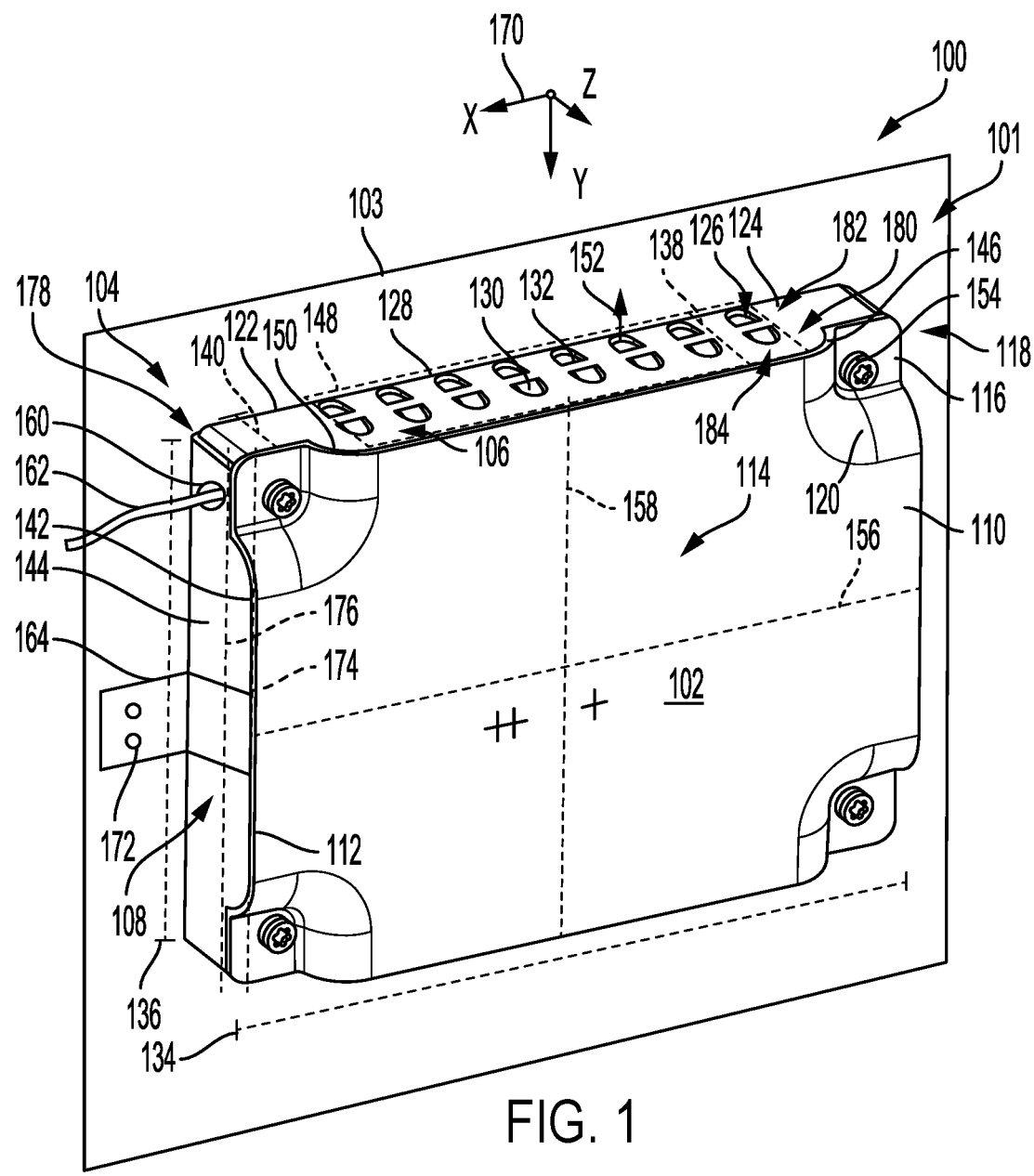
FIG. 1 shows an example of a chassis for an electronic package in accordance with one or more embodiments of the present disclosure.

FIG. 1 shows an example of an electronic package 100 included in a vehicle system such as an automotive infotainment system. As one example, the electronic package 100 may provide one or more functionalities associated with the automotive infotainment system, such as one or more of communication, entertainment, driver assistance, guidance, and navigation. An axis system 170 is shown in FIG. 1 and the other figures described herein.

The electronic package 100 may be mounted to a vehicle component. As one example, the electronic package 100 may be mounted to an instrument panel 103, shown schematically. As a few additional, non-limiting examples, electronic package 100 may be mounted inside a headliner, near a pillar, in a glove compartment, a trunk, or other space of the vehicle system. It may be appreciated that the electronic package 100 may be mounted to other locations in an automotive vehicle and by other means than the examples given herein.

Figure 2:
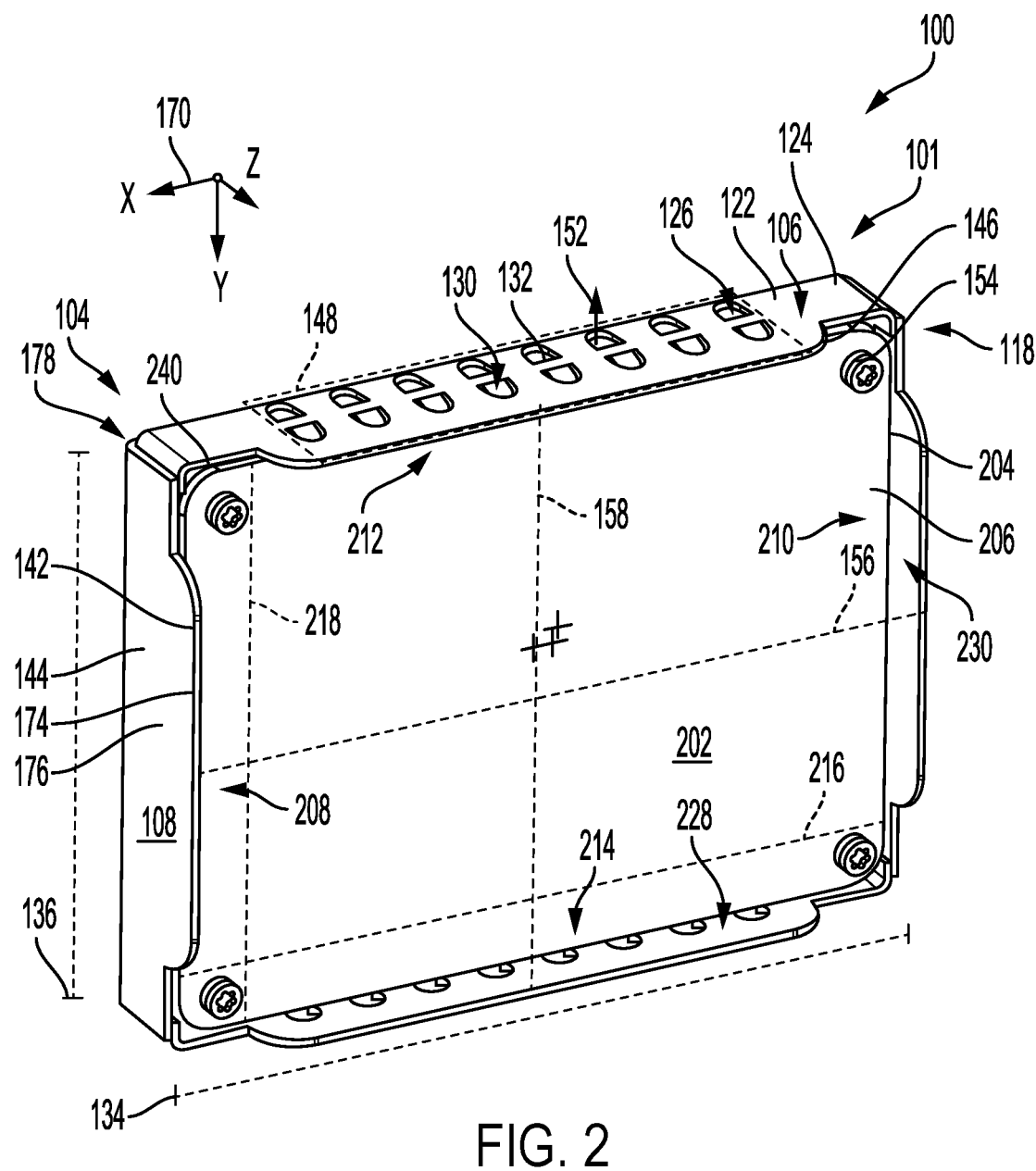
FIG. 2 shows the chassis for an electronic package with a cover plate removed in accordance with one or more embodiments of the present disclosure.

The electronic package 100 may include chassis 101 enclosing and coupled to a circuit board (202 in FIG. 2). In one example, the chassis 101 may be substantially box-shaped and flat. The chassis 101 may be symmetrical along a longitudinal center line 156 and a lateral center line 158. In one example, components of the chassis 101 described above the longitudinal center line 156 may be understood to be mirrored below the longitudinal center line 156 and components described to the right of the lateral center line 158 may be understood to be mirrored on the left of the lateral center line 158. The chassis 101 may have a length of dimension 134 that may be slightly longer than a height of dimension 136 and a first width of dimension 138 that may be approximately one sixth of the dimension 134. In some examples, the relative lengths of dimension 134, dimension 136, and dimension 138 may be different. The chassis 101 housing 104 comprising five panels joined to form the base and side walls of an open box and cover plate 102 functioning as a lid to the box. The first panel or back panel (e.g., the base of the box; 302 in FIG. 3A) of the housing 104 may be arranged in parallel in an xy plane with the cover plate 102. The panels or side walls of the housing 104 include a first wall 106 arranged in parallel in an xz plane to a third wall (228 in FIG. 2) and a second wall 108 arranged in parallel in a zy plane to a fourth wall (230 in FIG. 2). The first wall 106 of the housing 104 may include a first perimeter 122 and first exterior surface 124. The second wall 108 of the housing 104 may include a second perimeter 142 and a second exterior surface 144.

The housing 104 may be shaped to enclose and support the circuit elements contained therein. Each side wall of the housing 104 may have a similar shape. For example, the first wall 106 may have a first height of dimension 138 that is greater than a shorter, second height of dimension 140, and an approximate length of dimension 134, e.g., similar to the overall length of the chassis 101. The first wall 106 may be the shorter, second height of dimension 140 at a first corner 118 of the chassis 101. The first wall 106 may include a first arched portion 146 where the panel height increases to the first height of dimension 138. The first wall 106 may be the first height of dimension 138 in a central region 148. The first wall 106 may include a second arched portion 150 where the panel height decreases down to the shorter, second height of dimension 140 at a second corner 178 of the chassis 101.

The first wall 106 may be perforated with a plurality of bent tabs 126, also herein referred to as tabs 126. In one example, the bent tabs 126 may be arranged in rows and columns within the central region 148. For example, the bent tabs 126 may be arranged in a first row 180 and a second row 182. In one example, the first row 180 may be positioned directly above the second row 182 and aligned in a plurality of columns 184. In some examples, such as depending on a mounting orientation of the chassis 101, the first row 180 may be a top row and the second row 182 may be a bottom row. In one example, the tabs 126 may be formed by stamps 128 or cuts into the first wall 106. The stamps 128 into the first wall 106 may form bent tabs 126 having a free fin part or fin 130 and an attached bend or bend 132 located opposite from the fin 130. The fin 130 of the tabs 126 may bend inward in a direction of an interior (see FIG. 2) of the electronic package 100. For example, the tabs 126 may bend inward in the direction of the longitudinal center line 156. In one example, the bend 132 may be oriented to be parallel to the x-axis. In another example the bend 132 may be oriented to be parallel with the z-axis. The bent tabs 126 may be shaped to make a vent opening 152 and to contact the enclosed circuit elements along the fin 130, which will be described in more detail below. In one example, the third wall 228 may similarly include rows and columns of bent tabs 126 such that the chassis 101 may include a pair of opposing parallel walls having bent tabs 126. When mounted in a system with the first wall 106 being the top and the third wall 228 being the bottom, the bent tabs 126 arranged on opposing parallel walls enables passive or natural convection for increased cooling of the enclosed circuit elements. The direction of the arrow of vent opening 152 indicates the direction of cooling through the vents provided by the tabs 126. In other examples, more than two walls of the housing may include bent tabs 126 or additional features, such as a fan, for increased cooling.

The cover plate 102 may be shaped to mate with the housing 104. Looking down the z-axis, the cover plate 102 may be approximately rectangular. The cover plate 102 has a cover exterior surface 110 and a cover perimeter 112. The cover exterior surface 110 may be shaped to include a broad planar portion 114 and a depression 116 at each corner (e.g., first corner 118, second corner 178). The broad planar portion 114 of the cover exterior surface 110 may occupy a first xy plane 174. Each depression 116 may be planar with respect to a second xy plane 176. With respect to surface area, most of the cover exterior surface 110 occupies the first xy plane 174. The cover exterior surface 110 includes a sloping portion 120 at each corner (e.g., first corner 118, second corner 178) connecting the broad planar portion 114 to each depression 116 of the cover plate 102. The cover perimeter 112 of the cover plate 102 may mate with the perimeters of each panel (e.g., first perimeter 122 of first wall 106) along a rim (240 in FIG. 2) of the housing 104. The cover plate 102 may be affixed to the housing 104 over the rim 240 by fasteners 154, such as bolts, screws, and so on. As one example, fasteners 154 may be inserted through the cover exterior surface 110 in the depression 116 of the first corner 118 and into each of the other three corners.

The chassis 101 may be formed of metallic materials to prevent EMI interference between other electrical components of a vehicle and the enclosed circuit board. The chassis 101 may provide EMI shielding of circuit elements, such as circuit board 202. For example, the chassis 101 of package 100 may provide a Faraday cage for enclosed circuit elements. The chassis 101 may shield circuit boards from interference from automotive elements such as motors, vehicle actuator, and so on. The chassis 101 may allow for external connections. Plug elements of the circuit board, such as cable 162 shown exiting via a through hole 160 in second wall 108, may extend beyond the chassis 101 to allow for connection to one or more other devices or components. The through hole 160 may be defined by an opening on the second exterior surface 144 and an opening on an interior surface (not shown) of the second wall 108. According to one example, chassis 101 may be formed of one or more electrically conductive and magnetically permeable materials to provide EMI shielding, including but not limited to aluminum (e.g., die-cast, extruded, forged, etc.) and steel (e.g., cold-rolled sheet metal, etc.). An advantage of the disclosure described herein is by forming the chassis 101 from sheet metal, bent tabs 126 may be stamped (e.g., cut) into metal and bent inward in the direction of an interior of the chassis. Rather than discarding as waste perforated material to make a ventilation hole, the bent tabs 126 remain attached, thus increasing the heat sinking capacity of the chassis without increasing the package size. The heat sinking capacity is increased by retaining the bent tabs 126 due to the increased total surface area and increased total volume of heat sinking material of the chassis 101.

As one example, electronic package 100 is shown mounted to the instrument panel 103 via a pair of brackets 164. As one example, a first bracket of the pair of brackets 164 is shown affixed to the second wall 108 of the housing 104 and a second bracket of the pair of brackets 164 may be arranged in parallel on the fourth wall 230. In other examples, a pair or more of brackets may be affixed to the cover plate 102 or to the housing 104 and the cover plate 102. The pair of brackets 164 may be affixed to the chassis 101 via brazing or welding. As another example, the pair of brackets 164 may be fastened to the chassis 101 using screws or bolts. The brackets 164 may include through holes 172 for mounting the electronic package 100 to the instrument panel 103 via fasteners such as bolts or screws.

FIG. 2 shows the chassis 101 for the electronic package 100 with the cover plate 102 removed to show an interior including enclosed circuit elements such as circuit board 202. In one example, circuit board 202 may be a printable circuit board having a plurality of integrated circuits (e.g., first integrated circuit 352 in FIG. 3B, second integrated circuit 402 in FIG. 4A). Looking down the z-axis, the circuit board 202 may be shaped to mate with the housing 104. The circuit board 202 may have a board perimeter 204, a first external surface or board first surface 206, and a second external surface or board second surface (354 in FIG. 3B). In one example, the general shape of the circuit board 202 may be symmetrical along the longitudinal center line 156 and the lateral center line 158. The circuit board 202 may be approximately rectangular, having a length of dimension 216 and a height of dimension 218. In one example, dimension 216 may be longer than dimension 218. In other examples, the relative lengths of dimensions 216, 218 may be similar and in other examples, dimension 218 may be longer than dimension 216. The circuit board 202 may have a first pair of straight, parallel sides, or a board first side 208 and a board second side 210, and a second pair straight, parallel sides, or a board third side 212 and a board fourth side 214. The board perimeter 204 may be flush with (e.g., abut) the second wall 108 along the board first side 208, the fourth wall 230 along the board second side 210, the first wall 106 along the board third side 212, and the third wall 228 along the board fourth side 214. The circuit board 202 may make contact with at least some of the plurality of bent tabs 126 of first wall 106 and the third wall 228.

Figure 3A:
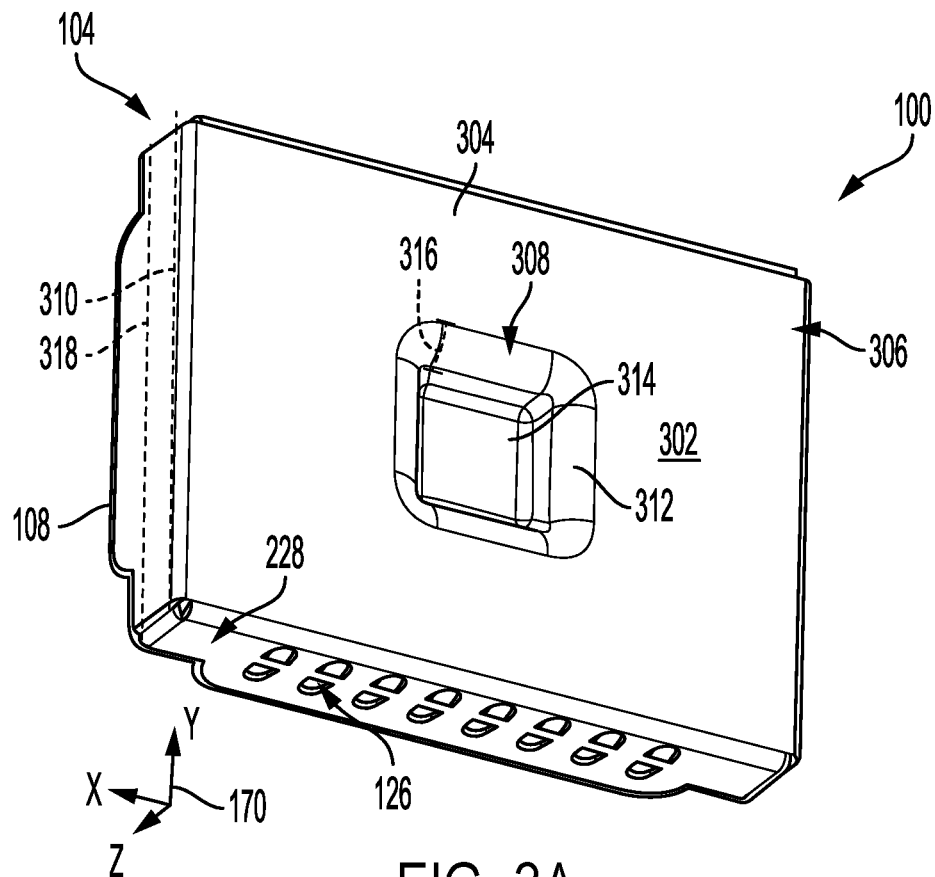
FIG. 3A shows an underside view of the chassis in accordance with one or more embodiments of the present disclosure.
Figure 3B:
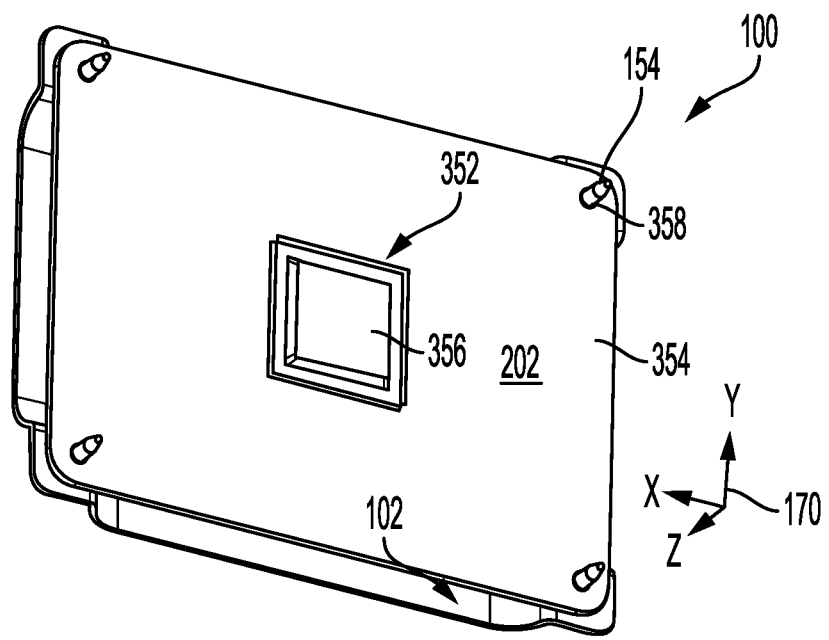
FIG. 3B shows enclosed components of the electronic package in accordance with one or more embodiments of the present disclosure.

FIG. 3A and FIG. 3B show further views of the electronic package 100. FIG. 3A is a view looking at the back panel 302 of the housing 104 of the chassis 101. FIG. 3B is a view of the circuit board 202 affixed the cover plate 102. The housing 104 of the chassis 101 is removed to show a board second surface 354 of the circuit board 202 and a first integrated circuit 352. Together, FIG. 3A and FIG. 3B illustrate an example surface modification of the housing 104 designed to increase thermal transfer from the circuit board 202 to the chassis 101.

The back panel 302 of the housing 104 includes an exterior surface 304. The exterior surface 304 may be shaped to include a planar portion 306 and one or more depression features, shown as dimple feature 308. The planar portion 306 of the exterior surface 304 may occupy a third xy plane 310. In one example, the dimple feature 308 may be an approximately square depression having sloped sides 312 and a square base 314. The square base 314 may be planar with respect to a fourth xy plane 318. The sloped sides 312 may have a depth of dimension 316.

The one or more depression features may be formed into the back panel 302 to increase contact with the one or more integrated circuits. For example, the dimple feature 308 may be the depth of dimension 316 so as to make contact with a face 356 of the first integrated circuit 352. Dimension 316 may be relatively deeper or shallower based on a position of the face 356 of the integrated circuit 352. In one example, the dimple feature 308 may make contact with the face 356 of the first integrated circuit 352 through a thermal pad or gap filler. The heat may transfer from the first integrated circuit 352, to the housing 104, and dissipate though the side panels and bent tabs 126 of the chassis 101 to the surrounding air via natural convection or fan-driven convection.

FIG. 3B, further illustrates the cover plate 102 joined with the circuit board 202. As one example, each of the fasteners 154 may be inserted via through holes (not shown) in the cover plate 102 aligned with through holes 358 in the circuit board 202. The fasteners 154, when affixed over the cover plate 102, may apply pressure evenly to increase contact between the circuit board 202 and the chassis 101 for improved thermal transfer and EMI shielding.

Figure 4A:
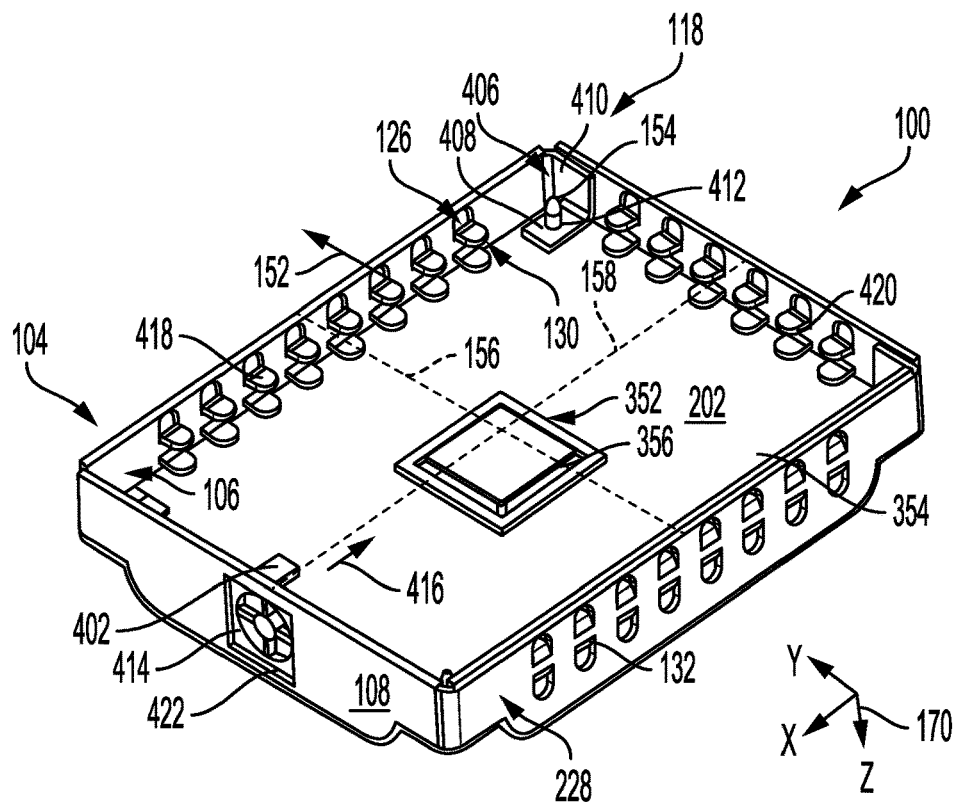
FIG. 4A shows a first interior view of the electronic package in accordance with one or more embodiments of the present disclosure.
Figure 4B:
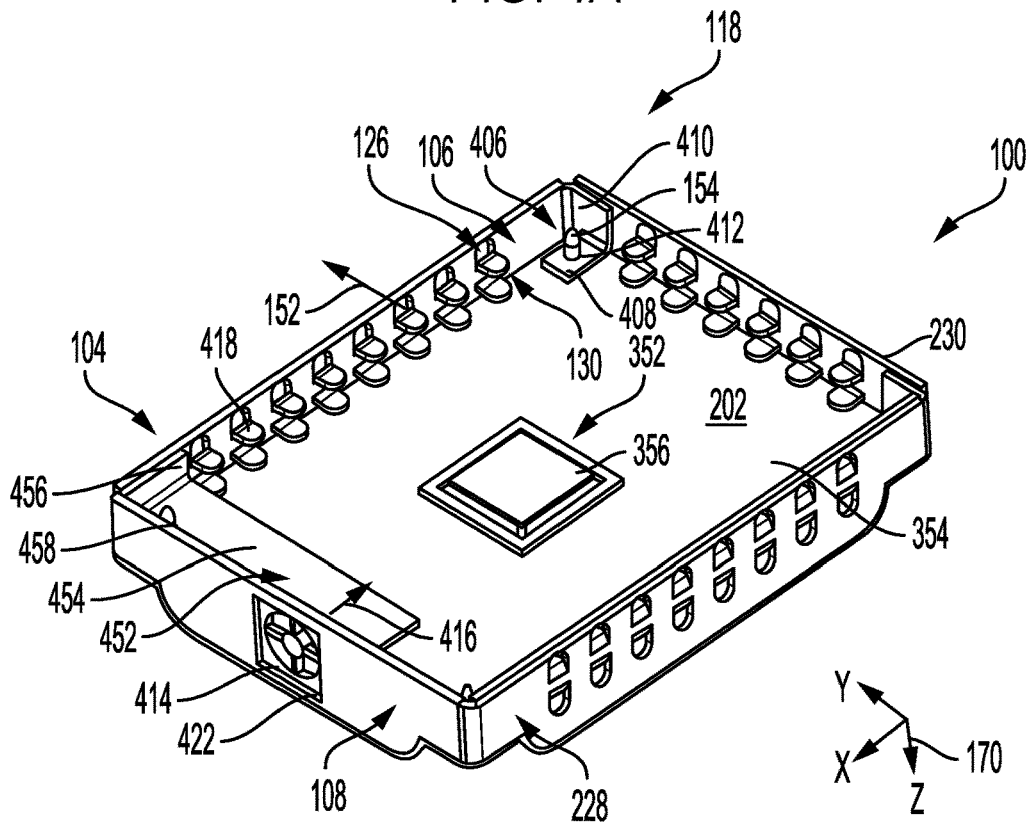
FIG. 4B shows a second interior view of the electronic package in accordance with one or more embodiments of the present disclosure.

FIG. 4A and FIG. 4B show interior views of the electronic package 100. The back panel 302 of the chassis 101 is removed to show the integrated circuits of the circuit board 202 and chassis components for increasing thermal management capability and EMI shielding.

Figure 7:
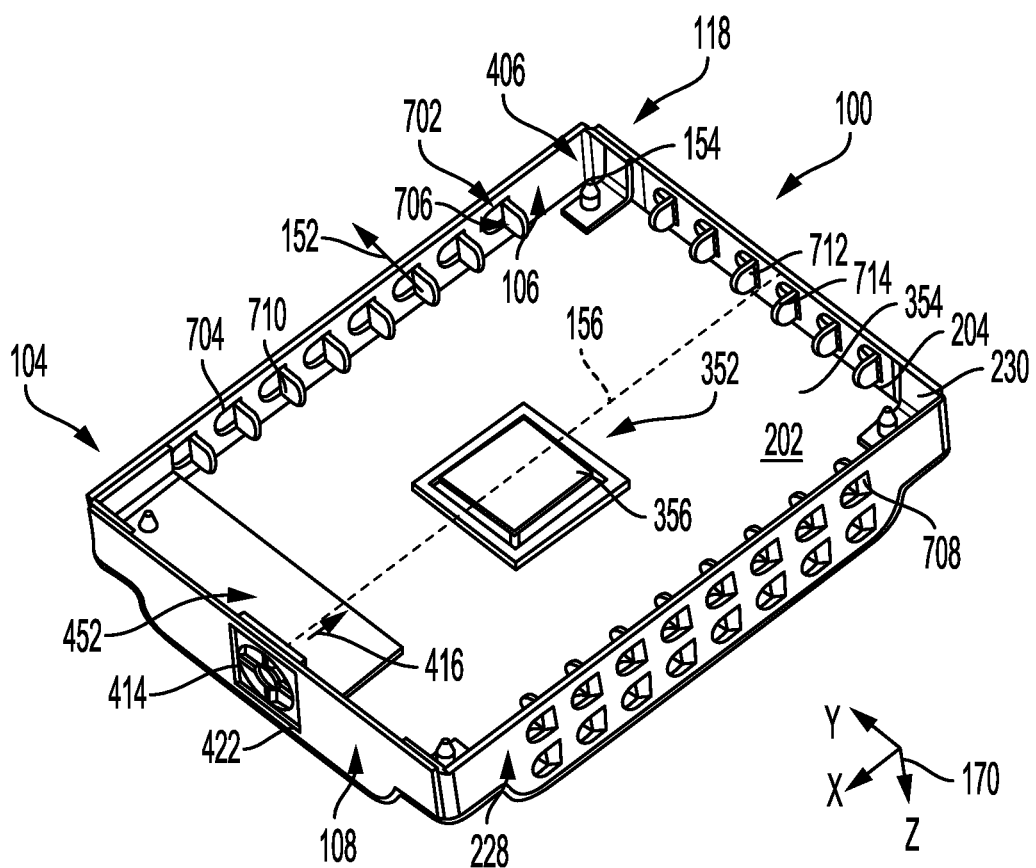
FIG. 7 shows another interior view of the electronic package including a second example of a configuration for bent tabs in accordance with one or more embodiments of the present disclosure.

In one example, the fin 130 of the bent tabs 126 may be D-shaped and relatively flat, having a first face 418, a parallel, second face (502 in FIG. 5A), and a small side surface 420. A first tab orientation is shown in FIGS. 4A and 4B. As one example, the bend 132 of the tabs 126 may be oriented parallel to the x axis. The tab 126 may be bent along the bend 132 such that the first face 418 and the second face 502 may be arranged approximately perpendicular to the wall. In other words, the first face 418 and second face 502 may be planar with respect to an xy plane that may be parallel with the board first surface 206 and the board second surface 354. Oriented in this way, the chassis 101 may make contact with solder bumps on an external surface of the circuit board. For example, the chassis 101 may make contact with the board second surface 354 at or near the board perimeter 204 along the second face 502 of the tabs 126. A second tab orientation is shown in FIG. 7, where the bend 132 of the tabs 126 may be oriented parallel to the z axis. Oriented in this way, the small side surface 420 of the tabs 126 may make contact with solder bumps on the external surface of the circuit board.

As one example, solder bumps on the circuit board 202 may sit on the tabs 126 while the circuit board 202 is secured to the chassis 101 by fasteners 154, such as screws, at each corner (e.g., first corner 118). Due to the compressive forces from the fasteners 154, the bent tabs 126 may make robust contact with the circuit board 202 for improved EMI shielding and increased resiliency to vibration. Additionally, the face of the tabs 126 making face sharing contact with the circuit board 202 may provide a greater surface area of contact for increased heat transfer from heat producing circuit elements to the chassis 101.

The chassis 101 may include a plurality of brackets for coupling the circuit board 202 to the housing 104. In one example, brackets may be formed from sheet metal, such as copper or aluminum, and may act as heat sinks that may be mounted over integrated circuits, such as first integrated circuit 352 and second integrated circuit 402, for improved thermal transfer. As one example, corner brackets 406 may be positioned at each corner (e.g., first corner 118, second corner 178, and so on) of the chassis 101. As one example, corner brackets 406 may be L-shaped, including a first part 408 in contact with the circuit board 202 and a second part 410 in contact with a panel of the housing 104. Long brackets 452 may similarly be mounted over circuit elements, such as over the second integrated circuit 402. Long brackets 452 may include a third part 454 in contact with the circuit board and a fourth part 456 in contact with a panel of the housing 104. In some examples, brackets may be mounted over an integrated circuit with a layer of thermal interface material applied therebetween. Example thermal interface materials may include thermal paste, gap fillers, or gap pads. Corner brackets 406 may include a through hole (e.g., 412) aligned with the through hole (e.g., 358 in FIG. 3B) of the circuit board 202 through which fasteners 154 may be inserted. Similarly, long brackets 452 may include a through hole (e.g., 458) that aligns with a through holes of the circuit board. The plurality of brackets increase the surface area of heat sinking material from which the chassis 101 is formed without increasing the footprint of the electronic package 100. Brackets may also provide secure attachment points for coupling the circuit board 202 to the chassis 101 to increase stability and robustness of EMI shielding.

The electronic package 100 as configured in FIG. 4A and FIG. 4B may include a plurality of bent tabs 126 stamped into the first wall 106, the third wall 228, and the fourth wall 230. By functioning as vents, the bent tabs 126 draw airflow through the interior of the chassis 101 for cooling the enclosed electronics via convection. In one example, the housing may include a fan for forced convection. In one example, the fan may be positioned in a wall on an opposite side of the housing from a wall having bent tabs. For example, a fan 414 may be positioned in a cutout 422 in the second wall 108. The cutout 422 may be fully punched out of (e.g., cut free from or stamped into) a wall of the housing 104. As one example, a method for cooling the electronic package 100 may include operating the fan 414 to blow air from inside the enclosure to outside the enclosure. As one example, the fan 414 may be used optionally to increase airflow in the direction indicated by arrow 416. The fan 414 may be turned on when increased airflow is desired. When the fan 414 is off, air flow directed upwards by buoyancy effect may be predominant such as in the direction indicated by the arrow of vent opening 152.

Figure 5A:
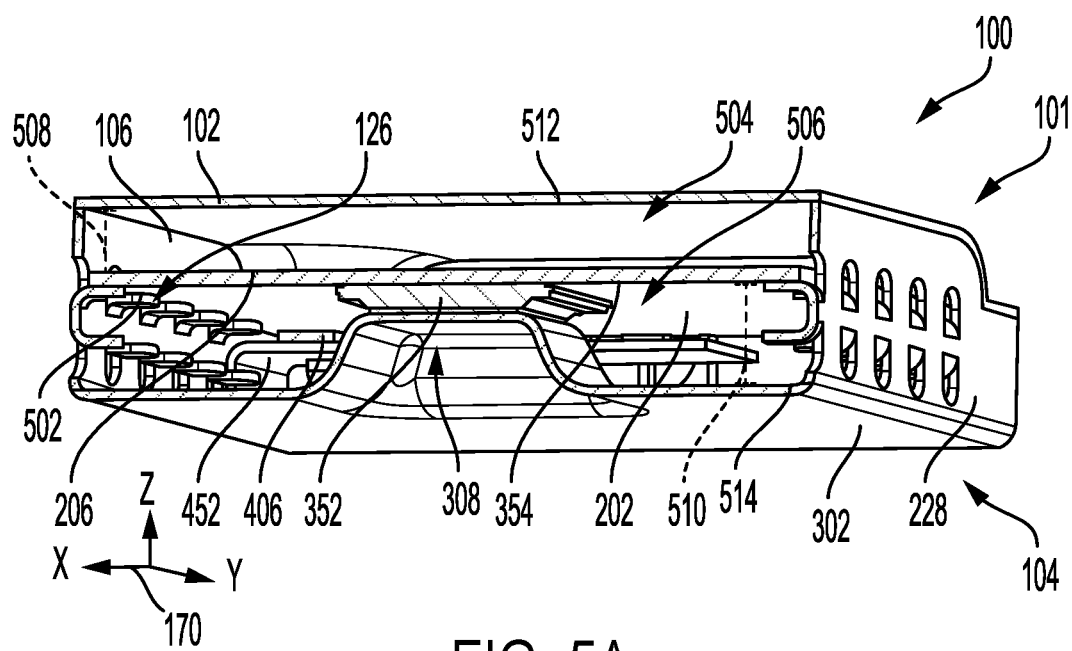
FIG. 5A shows a cross section view of the electronic package in accordance with one or more embodiments of the present disclosure.

FIG. 5A shows a cross section view of the chassis 101 that may be included in the electronic package 100 for a vehicle system. The interior of the chassis 101 may include a first air gap 504 defined by a three-dimensional void between the circuit board 202 and the cover plate 102 and a second air gap 506 defined similarly between the circuit board 202 and the back panel 302 of the housing 104. The first air gap 504 may have an approximate width of dimension 508 that may be the difference in dimension between the internal surface 512 of the cover plate 102 and the board first surface 206 of circuit board 202. The second air gap 506 may have an approximate width of dimension 510 that may be the difference in dimension between the board second surface 354 of the circuit board 202 and an internal surface 514 of the back panel 302. The air gaps may increase thermal convection (e.g., natural or fan-driven) through the chassis 101.

The cross section view further illustrates contact surfaces between the chassis 101 and the circuit board 202 for heat transfer and EMI shielding. For example, contact may occur between the chassis 101 and the circuit board 202 along the first face 418 of the tabs 126 and the board second surface 354 of the circuit board 202. In one example, one or more long brackets 452 may transfer heat from the circuit board 202 to one or more of the corner brackets 406 of the chassis 101. Heat may be transferred to the chassis 101 from the first integrated circuit 352 being in face-sharing contact with the internal surface 514 of the dimple feature 308.

Figure 5B:
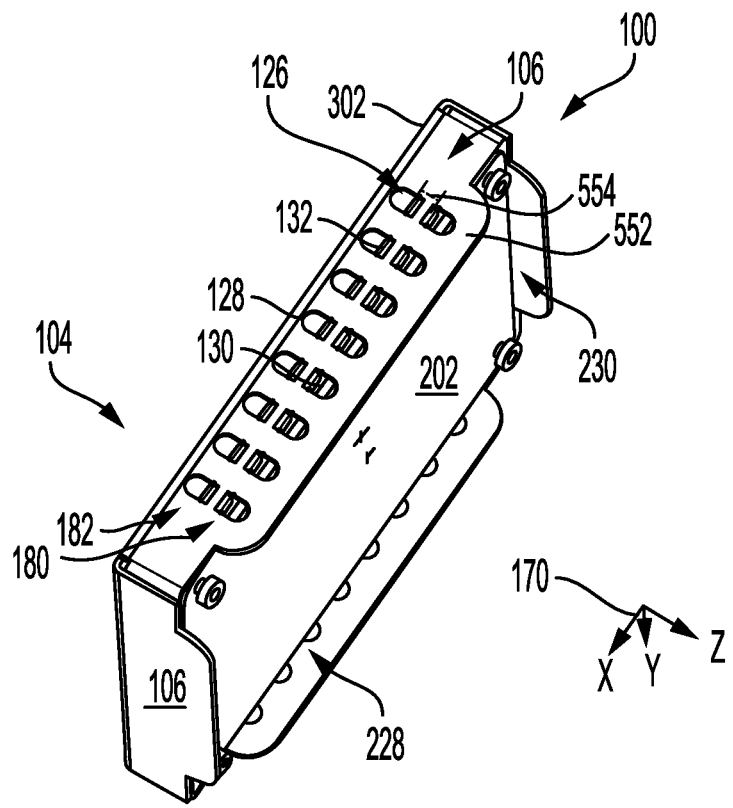
FIG. 5B shows a perspective view of the electronic package in accordance with one or more embodiments of the present disclosure.

FIG. 5B illustrates a side view of the electronic package 100 with the cover plate 102 removed. The side view shows the approximately D-shaped stamp 128 into the first wall 106 from which tabs 126 are formed. A portion of a housing exterior surface 552 forms the first face 418 of the fin 130. In one example, the first row 180 of the tabs may bend in an opposite direction from the second row 182 of tabs 126. For example, the first row 180 of tabs 126 may bend down such that portion of the housing exterior surface 552 forming the first face 418 touches the circuit board 202. As another example, the second row 182 of tabs 126 may bend up such that the portion of the housing exterior surface 552 forming the first face 418 faces the internal surface of the back panel 302. Configured in this way, the first row 180 of tabs 126 may contact the circuit board 202 and the second row 182 of tabs 126 may be spaced away from the other set by dimension 554.

Figure 6:
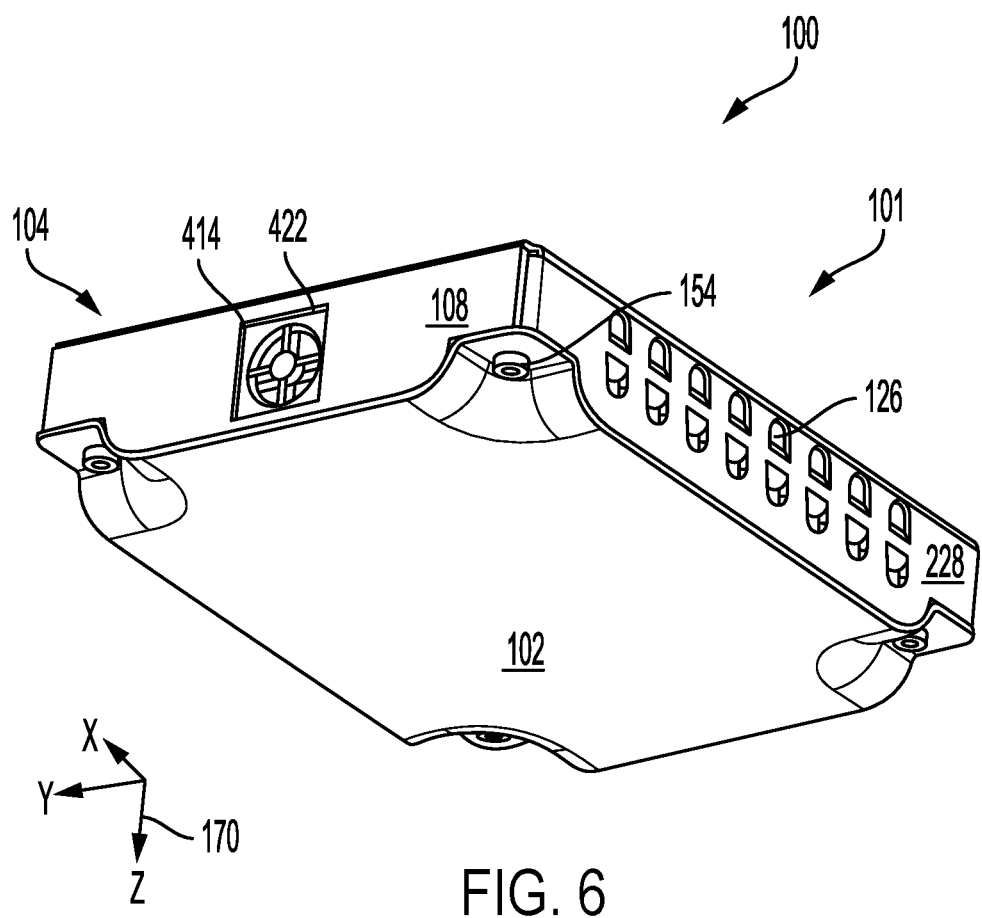
FIG. 6 shows another perspective view of the chassis for the electronic package in accordance with one or more embodiments of the present disclosure.

FIG. 6 shows a perspective view of the chassis 101 that may be included in the electronic package 100 for a vehicle system. The view includes the cover plate 102 affixed to housing 104 via the plurality of fasteners 154. The view shows the plurality of bent tabs 126 stamped into the third wall 228 and a fan 414 installed in the second wall 108. When the cover plate 102 is joined to the housing 104, evenly distributed compression across the housing securely presses the tabs 126 against the enclosed electronics for robust EMI shielding and thermal management. The tabs 126 dually functioning as vents and in combination with the fan 414 may further increase airflow for faster cooling of enclosed electronics.

FIG. 7 shows an interior view of the electronic package 100 including a second example for bent tabs 702. The back panel 302 of the chassis 101 is removed to show the circuit board 202 and chassis components for increasing thermal management capability and EMI shielding.

Similar to the above examples, the bent tabs 702 may be formed by a stamp 704 or cut into one or more panels of the chassis. The tabs 702 may have an attached bend or bend 708 and a free fin part or fin 706. In one example, the fin 706 may be D-shaped and flat, having a first face 710, a parallel, second face 712, and a small side surface 714. As one example, the bend 708 of the tabs 702 may be oriented parallel to the z axis. The fin 706 of the tabs 702 may bend inward, in the direction of the interior of the electronic package 100, along the bend 708. For example, the tabs 702 may bend inward in the direction of the longitudinal center line 156. Similar to the above examples, the bent tabs 702 may be shaped to make a vent opening 152 and a contact surface for heat transfer from the circuit board 202 to the chassis 101. In one example, the first face 710 and the second face 712 of the tabs 702 may be arranged approximately perpendicular to the surface of the panel. Oriented in this way, the small side surface 714 of the tabs 702 may make contact with solder bumps on the board second surface 354 at or near the board perimeter 204.

In one example, the electronic package 100, as configured in FIG. 7, may include the plurality of bent tabs 702 stamped into the first wall 106, the third wall 228, and the fourth wall 230. The chassis 101 may include the fan 414 positioned in the second wall 108 for increased convection as well as a plurality of brackets such as corner brackets 406 and long brackets 452 for increased heat conduction from the circuit board 202 to the heat sinking chassis. Similar to the above examples, the tabs 702, the long brackets 452, corner brackets 406, and fasteners 154 may securely position the circuit board 202 within the chassis 101.

In this way, an electronic package for a vehicle system including a chassis having a plurality of bent tabs coupled to a circuit board may improve thermal management and EMI shielding for high performance automotive infotainment systems. Such improvements are enabled by retaining chassis material as bent tabs that function as vents, contact surfaces, and mini-fins. The chassis may be affixed to a vehicle component such as an instrument panel. By positioning bent tabs on an upper wall and lower wall of the chassis, the electronic package may take advantage of cooling via natural convection directed upwards by buoyancy effect. Additionally or alternatively, by including a fan positioned in a wall arranged opposite from a wall having bent tabs, the electronic package may increase cooling via forced convection. The technical effect of the electronic package for a vehicle system is increased cooling of enclosed electronics and EMI shielding without enlarging the overall footprint of the package.

The disclosure also provides support for an electronic package for a vehicle comprising: a chassis having a plurality of bent tabs forming a plurality of respective vent openings in the chassis, and a circuit board coupled to the chassis, wherein the bent tabs directly contact the circuit board. In a first example of the system, the bent tabs bend inward in a direction of an interior of the chassis. In a second example of the system, optionally including the first example, the bent tabs comprise a bend and a fin having a first face, a second face, and a small side surface. In a third example of the system, optionally including one or both of the first and second examples, the small side surface of the fin directly contacts an external surface of the circuit board. In a fourth example of the system, optionally including one or more or each of the first through third examples, a face of the fin directly contacts an external surface of the circuit board. In a fifth example of the system, optionally including one or more or each of the first through fourth examples, the first face, and the second face of the fin are oriented perpendicular to a surface of the circuit board. In a sixth example of the system, optionally including one or more or each of the first through fifth examples, the first face and the second face of the fin are oriented parallel to a surface of the circuit board. In a seventh example of the system, optionally including one or more or each of the first through sixth examples, the bend is located opposite the fin of the bent tabs. In an eighth example of the system, optionally including one or more or each of the first through seventh examples, a face of the bent tabs makes face-sharing contact with an external surface of the circuit board. In a ninth example of the system, optionally including one or more or each of the first through eighth examples, the circuit board is joined to the chassis via fasteners inserted through a plurality of aligned through holes. In a tenth example of the system, optionally including one or more or each of the first through ninth examples, the bent tabs are arranged in a top row and a bottom row, and the top row of bent tabs bend in an opposite direction than the bottom row of bent tabs. In an eleventh example of the system, optionally including one or more or each of the first through tenth examples the chassis further comprising a back panel having a depression, wherein an internal surface of the depression makes face-sharing contact with an external surface of the circuit board. In a twelfth example of the system, optionally including one or more or each of the first through eleventh examples the chassis further comprising a first pair of opposing parallel walls and a second pair of opposing parallel walls. In a thirteenth example of the system, optionally including one or more or each of the first through twelfth examples, the bent tabs are located on the first pair of opposing parallel walls. In a fourteenth example of the system, optionally including one or more or each of the first through thirteenth examples, the system further comprises: a fan, and wherein the bent tabs are located on a first wall of the second pair of opposing parallel walls and the fan is located in a second wall of the second pair of opposing parallel walls.

The disclosure also provides support for a method for cooling an electronic package, comprising: operating a fan where the fan blows air from inside an enclosure to outside the enclosure, the enclosure comprised of a chassis having the fan, a plurality of bent tabs forming a plurality of respective vent openings in the chassis, and a circuit board coupled to the chassis, wherein the bent tabs directly contact the circuit board.

The disclosure also provides support for a system for a vehicle, comprising: a vehicle component, a chassis having a plurality of bent tabs forming a plurality of respective vent openings in the chassis mounted to the vehicle component, and a circuit board coupled to the chassis wherein the bent tabs directly contact the circuit board. In a first example of the system, the vehicle component is an instrument panel. In a second example of the system, optionally including the first example the chassis further comprising a housing, a cover plate fastened over the circuit board to the housing, and a pair of brackets coupled to at least one of the housing and the cover plate, wherein the chassis is coupled to the vehicle component by fasteners inserted through the pair of brackets. In a third example of the system, optionally including one or both of the first and second examples, the chassis is made from sheet metal.

The description of embodiments has been presented for purposes of illustration and description. The described systems are exemplary in nature, and may include additional elements and/or omit elements. The subject matter of the present disclosure includes all novel and non-obvious combinations and sub-combinations of the various systems and configurations, and other features, functions, and/or properties disclosed. As used herein, the term "approximately" is construed to mean plus or minus five percent of the range unless otherwise specified.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects. The following claims particularly point out subject matter from the above disclosure that is regarded as novel and non-obvious.

The invention claimed is:

1. An electronic package for a vehicle comprising:
   a chassis having a plurality of bent tabs forming a plurality of respective vent openings in the chassis; and
   a circuit board coupled to the chassis,
   wherein the bent tabs directly contact the circuit board, and
   wherein the bent tabs only bend inward in a direction of an interior of the chassis.

2. The electronic package of claim 1, wherein the bent tabs comprise a bend and a fin having a first face, a second face, and a small side surface.

3. The electronic package of claim 2, wherein the small side surface of the fin directly contacts an external surface of the circuit board.

4. The electronic package of claim 2, wherein one of the first or second face of the fin directly contacts an external surface of the circuit board.

5. The electronic package of claim 2, wherein the first face and the second face of the fin are oriented perpendicular to a surface of the circuit board.

6. The electronic package of claim 2, wherein the first face and the second face of the fin are oriented parallel to a surface of the circuit board.

7. The electronic package of claim 2, wherein the bend is located opposite the fin of the bent tabs.

8. The electronic package of claim 1, wherein a face of the bent tabs makes face-sharing contact with an external surface of the circuit board.

9. The electronic package of claim 1, wherein the circuit board is joined to the chassis via fasteners inserted through a plurality of aligned through holes.

10. The electronic package of claim 1, wherein the bent tabs are arranged in a top row and a bottom row, and the top row of bent tabs bend in an opposite direction than the bottom row of bent tabs.

11. The electronic package of claim 1, the chassis further comprising a back panel having a depression, wherein an internal surface of the depression makes face-sharing contact with an external surface of the circuit board.

12. The electronic package of claim 2, the chassis further comprising a first pair of opposing parallel walls and a second pair of opposing parallel walls.

13. The electronic package of claim 12, wherein the bent tabs are located on the first pair of opposing parallel walls, wherein the fin of each of the bent tabs are located on interior side of the first pair of opposing parallel walls.

14. The electronic package of claim 12, further comprising a fan, and wherein the bent tabs are located on a first wall of the second pair of opposing parallel walls and the fan is located in a second wall of the second pair of opposing parallel walls.

15. A method for cooling an electronic package, comprising:
   operating a fan where the fan blows air from inside an enclosure to outside the enclosure, the enclosure comprised of a chassis having the fan, a plurality of bent tabs forming a plurality of respective vent openings in the chassis, and a circuit board coupled to the chassis, wherein the bent tabs only bend inward in a direction of an interior of the chassis, and directly contact the circuit board.

16. A system for a vehicle, comprising:
   a vehicle component;
   a chassis having a plurality of bent tabs forming a plurality of respective vent openings in the chassis mounted to the vehicle component; and
   a circuit board coupled to the chassis,
   wherein the bent tabs only bend inward in a direction of an interior of the chassis, and directly contact the circuit board.

17. The system of claim 16, wherein the vehicle component is an instrument panel.

18. The system of claim 16, the chassis further comprising a housing, a cover plate fastened over the circuit board to the housing, and a pair of brackets coupled to at least one of the housing and the cover plate, wherein the chassis is coupled to the vehicle component by fasteners inserted through the pair of brackets.

19. The system of claim 16, wherein the chassis is made from sheet metal.

* * * * *